United States Patent
Daberko et al.

[11] Patent Number: 5,839,108
[45] Date of Patent: Nov. 17, 1998

[54] FLASH MEMORY FILE SYSTEM IN A HANDHELD RECORD AND PLAYBACK DEVICE

[75] Inventors: Norbert P. Daberko, Oceanside; Richard K. Davis, San Diego, both of Calif.

[73] Assignee: Norris Communications, Inc., San Diego, Calif.

[21] Appl. No.: 884,245

[22] Filed: Jun. 30, 1997

Related U.S. Application Data

[63] Continuation-in-part of Ser. No. 612,772, Mar. 7, 1996.
[51] Int. Cl.$^6$ .................................................... G11B 9/00
[52] U.S. Cl. ....................... 704/270; 711/103; 711/118; 711/115; 711/202; 711/206; 707/205
[58] Field of Search .......................... 704/270; 707/205; 711/113, 115, 118, 103, 202, 206

[56] References Cited

U.S. PATENT DOCUMENTS

| | | |
|---|---|---|
| 4,685,057 | 8/1987 | Lemone et al. . |
| 5,070,032 | 12/1991 | Yuan et al. . |
| 5,172,338 | 12/1992 | Mehrotra et al. . |
| 5,200,959 | 4/1993 | Gross et al. . |
| 5,263,160 | 11/1993 | Porter et al. . |
| 5,268,870 | 12/1993 | Harari . |
| 5,337,275 | 8/1994 | Garner . |
| 5,341,330 | 8/1994 | Wells et al. . |
| 5,357,475 | 10/1994 | Hasbun et al. . |
| 5,404,485 | 4/1995 | Ban . |
| 5,437,020 | 7/1995 | Wells et al. . |
| 5,448,577 | 9/1995 | Wells et al. . |
| 5,454,103 | 9/1995 | Coverston et al. . |
| 5,491,774 | 2/1996 | Norris et al. ............................ 704/270 |
| 5,551,020 | 8/1996 | Flax et al. . |
| 5,581,723 | 12/1996 | Hasbun et al. .......................... 711/103 |
| 5,581,736 | 12/1996 | Smith . |
| 5,586,291 | 12/1996 | Lasker et al. . |
| 5,602,987 | 2/1997 | Harari et al. . |

OTHER PUBLICATIONS

Robert Sedgweick "Algorithms", Addison–Wesley Publishing Co. pp. 15–33.
Esokov et al. "Data Structures", Prentice–Hall, Inc., pp. 54–65, 184–191.
Aho et al. "Data Structure and Algorithms", Addison–Wesley Publishing Co., pp. 53–69.

*Primary Examiner*—Tod R. Swann
*Assistant Examiner*—J. Peikari
*Attorney, Agent, or Firm*—Thorpe, North & Western, L.L.P.

[57] ABSTRACT

A record/playback device for use with a removable, interchangeable, flash memory recording medium which enables noise dampened recording of voice data and CD quality stereo recording of music data. The device includes a port for receiving a flash memory module which can record data according to industry standard formats to enable the transfer of data to and from personal computers through swapping of flash memory media. Alternative forms of data input and output also include implementation of a barcode reader and an infra-red transceiver for the transfer of data to and from the device.

6 Claims, 4 Drawing Sheets

FLASH MEMORY FILE SYSTEM IN A HANDHELD RECORD AND PLAYBACK DEVICE

This patent application is a continuation-in-part of U.S. patent application Ser. No. 08/612,772, filed Mar. 7, 1996, for an operating system including improved file management for use in devices utilizing flash memory as main memory.

BACKGROUND OF THE INVENTION

1. Field of the Invention

This invention pertains to a system for memory management in a non-volatile, long-term storage medium utilized in audio recording and playback devices. More particularly, this system organizes flash memory such that data storage and retrieval is optimized so as to decrease system overhead and thereby increase data throughput, system stability and fault tolerance, while improving noise reduction, improving the quality of audio data recording and playback, and increasing versatility of data input and output methods.

2. Prior Art

The present invention hereinafter incorporates by reference the materials disclosed in U.S. Pat. No. 5,491,774 for a HANDHELD RECORD AND PLAYBACK DEVICE WITH FLASH MEMORY by Norris et al. This patent provides a detailed example of the benefits of flash memory in a portable recorder. Most importantly, the parent application provides an operating system which is optimized for use in the handheld record and playback device mentioned above.

The motivation for the improvements in the hardware and the software elements of the present invention originated in a desire of the inventors to substantially improve the quality of audio recording and playback in handheld record and playback devices. It is unprecedented to expect high quality recording and playback capabilities on such a reduced scale. Therefore, while the benefits of efficient organization of data stored in long-term storage media is becoming realized, there remain substantial drawbacks in audio quality. For example, implementation of a system which can provide reliable data (sound file) recording and retrieval typically comes at the price of reduced audio performance, and convenience to the user.

The parent application of the present invention was in part devoted to the practical implementation of replacing typical long-term storage media with a non-volatile counterpart, flash memory. The application included overcoming the inherent practical limitations of using flash memory by developing a sophisticated operating system to efficiently manage data stored and retrieved therefrom. Accordingly, the benefits of efficient data storage in flash memory became realized in a handheld recorder which is suitable for voice recording and playback.

The parent application also addressed the drawbacks of other prior art methods of file management designed specifically for use with flash memory such as the system taught in U.S. Pat. No. 5,404,485 issued to Ban. Ban, however, still takes a more conventional and disadvantageous approach of manipulating data stored in flash memory by first reading the data out to a large random access memory (RAM), manipulating the data in RAM, erasing the flash memory where the data was originally stored, and then writing the data from RAM back to a contiguous block of flash memory. Ban also disadvantageously creates a file structure similar to personal computer based DOS (disk operating system) which maps the location of stored data.

The method of Ban creates several severe overhead burdens on the system which substantially hurt system performance. More specifically, Ban uses a virtual memory mapping system similar to the DOS file allocation table (FAT), the virtual memory map converting virtual addresses to physical addresses. Using this method of indirection, Ban attempts to facilitate use of flash memory as RAM. The problem with this approach is that Ban creates the need for this indirection because data manipulation takes place outside of flash memory. Ban mistakenly teaches that the time wasted copying blocks of data from flash memory to RAM for manipulation then back into flash memory is unavoidable.

A further significant drawback to Ban is the lack of fault tolerance in a system that utilizes a virtual map stored partially in RAM. The system is inherently unstable because any loss of power to RAM destroys the map which must then be reconstructed before the system can read or write data to flash memory.

Another drawback of Ban is that the RAM requirement grows as flash memory grows. This is the consequence of using a virtual map whose size is dependent upon the total amount of RAM available, and is thus a ratio of the larger flash memory media in order to reflect a scaled version of what is stored in physical addresses.

Ban essentially teaches that it is necessary to follow the method already used in the conventional DOS operating system which also relies on long-term storage in conjunction with significant RAM resources. That is to say, the access to and structure of storage media is changed as little as possible so that the operating system does not have to be significantly altered to utilize flash memory.

While the objective of making a system see flash memory as RAM with its accompanying benefits of non-volatility is desirable, the approach taken by Ban fails to take full advantage of flash memory by continuing to rely heavily on RAM resources. This system then suffers from lack of fault tolerance which not only jeopardizes reliability, but slows down the entire system by requiring large data transfers between RAM and flash memory.

The drawbacks of Ban are accentuated when what is desired is to improve even further on the inventive hardware and software of the parent application and that disclosed in U.S. Pat. No. 5,491,774.

Accordingly, the challenge is to use an advanced operating system to control a non-volatile, long-term storage medium such as flash memory in an improved handheld audio recording and playback device capable of providing CD quality sound capabilities. It would be a further advantage to simplify the processing of audio data by directly controlling a sound processor. It would be yet another advantage to provide more versatile data input and output methods to simplify use of CD-quality audio data.

OBJECTS AND SUMMARY OF THE INVENTION

It is therefore an object of the present invention to provide a CD quality record/playback device utilizing a computer chip memory which offers long play operation similar to standard cassette tapes or compact disks.

It is a further object of this invention to provide such a device which has no moving parts, and in particular, no drive mechanism or means for moving a recording medium.

Another object of this invention is a record/playback device which utilizes nonvolatile memory stored in an integrated chip of compact size.

Another object of the invention is to provide a handheld recorder which provides noise reduction for voice recording, and stereo recording of CD quality for music recording.

Another object is to provide additional methods for data input and output which are not found in handheld record and playback devices.

Another object is to provide a bar code reader as a method for data input to the handheld record and playback device to enable scanning of bar code data which can also be associated with other data such as verbal commentary.

Another object is to provide an infra-red input and output transceiver for the handheld record and playback device, to enable receiving and sending of data via an infra-red communication port.

Another object is to provide program updates to the operating system of the handheld record and playback device.

Another object is to enable the flash memory to store data so as to appear readable to industry standard information storage and retrieval operating interfaces and operating systems.

Another object is to simplify circuitry of the handheld record and playback device.

Another object is to increase the audio resolution of the handheld record and playback device to enable CD quality input and output.

Another object is to enable a plurality of different flash memory storage devices utilizing different technologies to be used with a same handheld record and playback device.

Another object is to increase a sampling rate of data and provide improved compression algorithms to support CD quality audio capabilities.

Another object of the present invention to provide a file system for non-volatile, long-term storage media which has a low processing overhead requirement, thus increasing data throughput.

Another object of this invention to provide a file system which has particular application to the storage medium of flash memory.

Another object of the present invention to provide a file system which is significantly fault tolerant.

These and other objects are realized in a CD quality record/playback device for use with a removable, interchangeable, flash memory recording medium which enables extended recording of 30 minutes or more. The device includes at least one microphone element configured to receive and process sound into electrical signals and control circuitry coupled to the microphone element and including signal input circuitry, amplification circuitry, analog-to-digital conversion circuitry, memory circuitry, signal output circuitry and control logic circuitry for performing CD quality record and playback functional operations with respect to the electrical signals and other regulated components of the record/playback device. A receiving socket is electrically coupled to the memory circuitry and configured for electrical coupling with a flash memory module which is capable of retaining recorded digital information for storage in nonvolatile form. A speaker is coupled to the control circuitry for playback of recorded digital information and a power source is coupled to the control circuitry for supplying electrical power to the device.

In another aspect of the invention, noise reduction is advantageously provided when recording voice data. Through companding of the voice signal data, non-linear signal conditioning provides better sound resolution than is otherwise possible with a standard A/D conversion techniques. The noise cancellation is eliminated when recording music which would otherwise compromise true sound recording and playback.

The present invention also includes a method of memory management for a primary memory created from non-volatile, long-term storage media, in particular flash memory, which enables direct manipulation of data segments stored therein.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Figure 1:
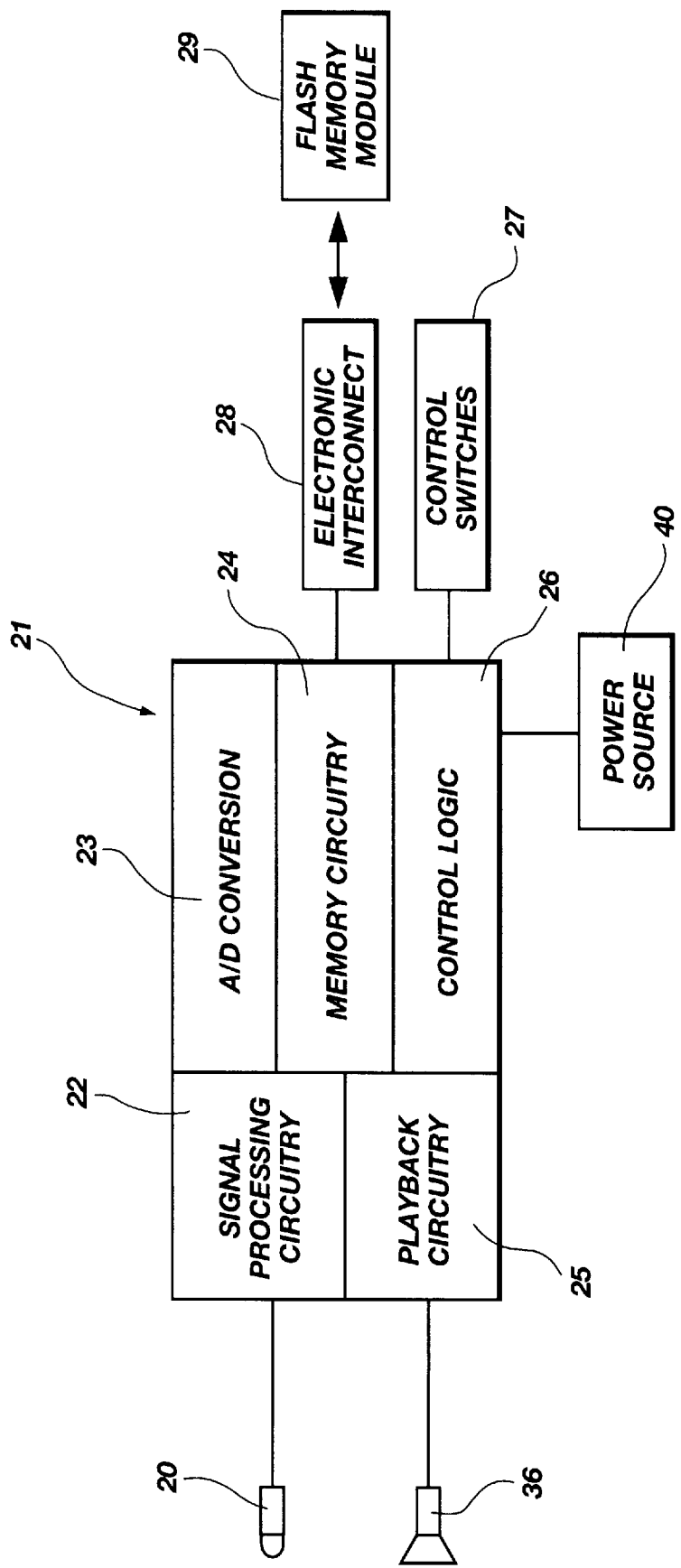
FIG. 1 is a block diagram providing a preferred functional layout for the prior art handheld record and playback device disclosed in U.S. Pat. No. 5,491,774.
Figure 2:
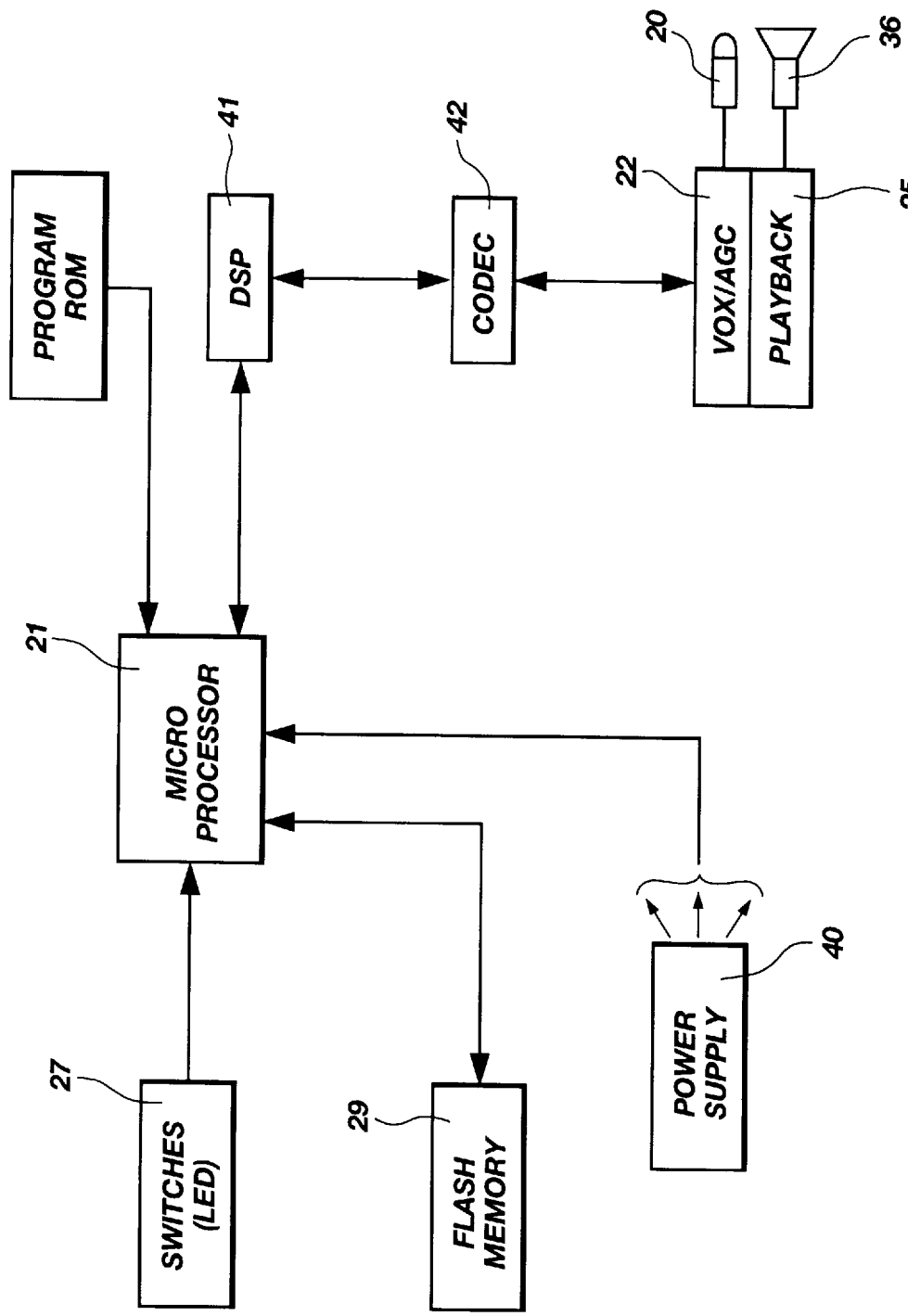
FIG. 2 is an alternate block diagram providing additional detail on the functional operations of the device taught in FIG. 1.

FIGS. 1 and 2 are block diagrams of the prior art described in U.S. Pat. No. 5,491,774, and previously incorporated by reference. It is useful to include a portion of the description so that the differences between the presently preferred embodiments and the prior art are more evident when examining FIGS. 3 and 4 of the present invention.

The invention disclosed in U.S. Pat. No. 5,491,774 offers the advantages of a removable element smaller in size than a cassette tape, but which has no moving parts. This removable component comprises a flash memory chip or module which has the capacity to store digital information without need for ongoing power support. The stored information is substantially permanent and is not susceptible to magnetic erasure or modification. This information can be immediately recovered by inserting the module into any compatible recorder for immediate playback. It therefore functions in a manner comparable to a conventional handheld recorder, but without the deficiencies noted above for mechanical drive systems.

The record/playback device comprises a microphone element 20 which is coupled to control circuitry 21 which processes the audio signal. Any microphone element may be used. The illustrated microphone is an electret element which is commonly used in handheld dictaphone equipment.

The control circuitry 21 includes signal input and amplification circuitry 22, analog-to-digital conversion circuitry 23, memory circuitry 24, signal output circuitry 25 and control logic circuitry 26 for performing record and playback functional operations with respect to the electrical signals and other regulated components of the record/playback device. Some of these functions are manually controlled by the operator with switches 27, as well as automatic operations controlled by software and firmware elements of the device. These components are discussed in greater detail hereafter.

An electronic interconnect means 28 is electrically coupled to the memory circuitry 24 and is configured for removable, electrical coupling with a flash memory module 29 capable of retaining recorded digital information for storage in nonvolatile form. The flash memory module is a digital memory storage device manufactured by Intel Corporation of Santa Clara, Calif. (see U.S. Pat. No. 5,267,218). This module 29 includes a plurality of memories arranged in an array, which can be electrically programmable or erasable.

A speaker 36 is coupled to the control circuitry 21, and specifically to the record playback circuitry 25, for playback of recorded digital information. Here again, the speaker device and attachment techniques are conventional parts of a recorder device. Selection of a specific speaker will depend on the desired quality of reproduction, as well as size limitation. For example, the speaker may consist of an ear plug jack and removable ear plug. Where the device is used for playback of music, a high fidelity speaker may be desired.

The control circuitry 21 and associated functional components are powered by a battery source 40, which is described in greater detail hereafter. Control circuitry is provided to enhance power conservation and to more effectively control allocation of voltage levels to circuitry components in accordance with specific power needs. The control circuitry includes embedded software commands for disabling certain circuitry components when not needed, as well as trigger commands to restore power for rapid response of disabled circuits. An alternate AC/DC input port is also provided.

An additional significant feature of the device comprises compression circuitry 41 and 42 coupled to the memory circuitry 24 (generally forming part of the control circuitry generally identified as 21) for compressing digital signal for storage in the flash memory module. This circuitry includes a DSP 41 and CODEC 42 which cooperate to compress data at a ratio of 16:1 for storage. Applying such data compression provides record times of 60 minutes or more, corresponding to traditional cassette tape recording times. These same components 41 and 42 cooperate as data retrieval circuitry for expanding compressed signal to a useful output signal to be sent to the speaker 36.

Overall system design is based on the use of a microprocessor which can drive all system components. This eliminates the need for use of multiple interface logic that demands a lot of board space within the circuitry. The DSP or digital support processor is coupled to the microprocessor and to a CODEC for coding and decoding the analog signal received from the microphone or transmitted to the speaker. Codec also performs the analog to digital conversion. It functions to receive the analog signal input and convert it to PCM or pulse code modulation and then feed this signal to the DSP. Conversely, when operating in play back mode, the DSP will feed pulse code modulation digital signal to the codec and the codec converts it to an analog signal that can be fed through an amplifier to a speaker.

Once the DSP compresses that data through customary hardware handshaking techniques, it feeds the data back to the microprocessor through a host bus. The basic functionality is as follows. If in a recording mode, the microprocessor sends commands to the DSP placing it into a record mode. The microprocessor places the DSP in a record mode where it retrieves data from the codec, compresses it and returns it to the microprocessor in the form of status words. The micro-controller then takes that data and sends it out to the PCMCIA connector or through the PCMCIA connector to the flash memory module.

To get the data back, the status request command is sent by the microprocessor and data is returned in compressed form. The compressed data is retrieved in 16 bit format. The specific addresses are written in the microprocessor for maintaining data location. The process involves sequential addressing through flash memory. The microprocessor's responsibility is to separate different messages and to be able to index the different messages and the different offsets within those messages. It maintains an address pointer and sequentially takes byte information from the DSP and writes it to memory in the form of a file. Conversely, the microprocessor in the play scenario places the DSP in a play mode and the DSP expects to be fed compressed data information at a specific rate. That rate is governed by hardware handshaking signals between the DSP and the microprocessor.

The microprocessor monitors data transfer status and every time the DSP is ready for another byte of information, it goes to flash, reads that byte of information from a location for spotting to a certain offset inside of a message, reads it back into the microprocessor and then writes it out to the DSP. The DSP takes blocks of 28 bytes and expands them and decompresses them into pulse code modulation. Each of those 28 bytes corresponds to 33 milliseconds of recorded analog signal.

The audio processing circuitry 22 and 25 includes circuitry that conditions the analog signal for both recording and playback. It feeds the signal through a differential amplifier. This boosts the signal and also removes common mode noise to produce a quieter signal.

Following this conditioning, the signal is processed through an automatic gain control circuit (AGC) where the recording level is automatically adjusted to a favorable level.

Also attached to the recording circuit is a VOX circuit for implementing voice operated recording. This circuit determines the threshold for automatically activating the recording mechanism. This feature is typically available on dictating equipment for facilitating hands-free use.

Having described some specific aspects of some block diagrams of the prior art, it is now meaningful to examine the improvements provided by the present invention. When looking at FIGS. 3 and 4, one of the most important modifications is the inclusion of a specific voice recording and playback embodiment which is distinct and separate from a music recording and playback embodiment. The purpose for this distinction is evident from a closer examination of the presently preferred voice and music embodiments.

Figure 3:
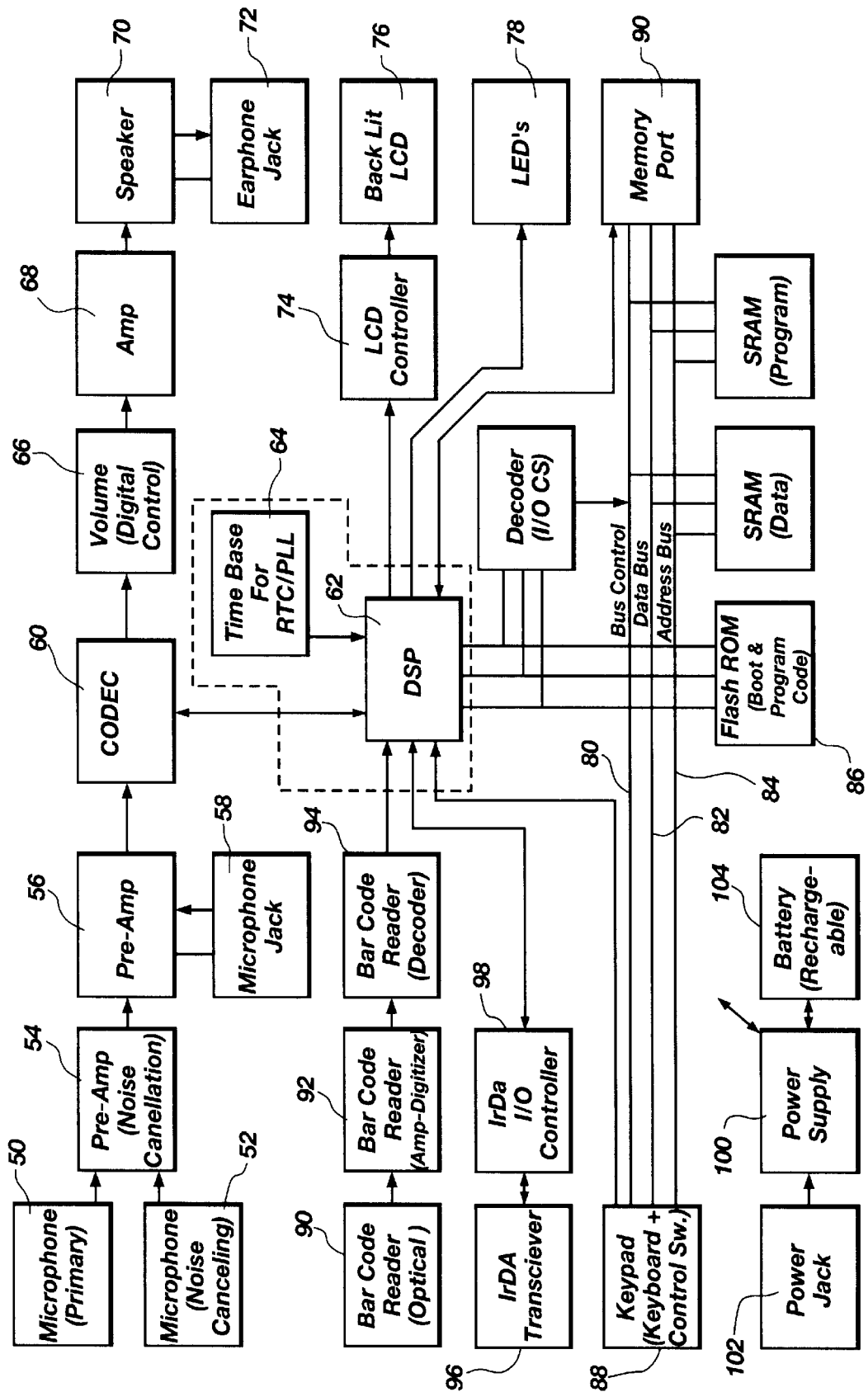
FIG. 3 is a block diagram of the components in a presently preferred embodiment of the present invention which enables a handheld record and playback device to record and playback voice data using noise cancellation in accordance with the teachings of the present invention.

FIG. 3 illustrates in a block diagram the components of a system which enables a handheld record and playback device typically smaller than a dictaphone to record and playback voice data using noise cancellation in accordance with the teachings of the present invention.

A first area of improvement is in the microphone input. Specifically, there are now provided a primary microphone 50 and a noise canceling microphone 52. In other words, the noise canceling microphone 52 is able to provide a signal which is useful in canceling noise received by the primary microphone 50, using techniques which are well known to those skilled in the art. It is important to realize that this function is desirable when recording a voice as opposed to the situation when music is being recorded. Accuracy in recording music is a very distinct process from accurately recording a voice. For example, it is not as important that a voice being played back sound as close as possible to the actual voice which was recorded. What is important is that the voice be distinct and distinguishable from distracting or interfering noise in the background. Consequently, accuracy in reproducing the recorded voice is advantageously sacrificed for clarity.

The function of noise cancellation is accomplished utilizing a first pre-amplifier 54, also by utilizing methods well known to those skilled in the art. A second pre-amplifier 56 is then utilized for the purposes of automatic gain control and voice activated recording, as is explained in the previously issued U.S. Pat. No. 5,491,774. Accordingly, an external microphone jack 58 is provided to assist in these functions. Therefore, despite the small size of the present invention, it accomplished acoustical noise reduction at the microphone input.

Before examining other methods of data input, the other elements of the embodiment of FIG. 3 include a CODEC 60. As explained in the prior art, the CODEC 60 is utilized for coding and decoding the analog signal received from the microphone or transmitted to the speaker. The CODEC 60 also performs the analog to digital conversion. It functions to receive the analog signal input and convert it to pulse code modulation (PCM) and then feed this signal to a digital signal processor (DSP) 62. Conversely, when operating in play back mode, the DSP 62 will feed pulse code modulation digital signals to the CODEC 60 and the CODEC 60 converts it to an analog signal that can be fed through an amplifier to a speaker.

An important distinction between the voice and the music embodiments also takes place here. The voice embodiment utilizes companding to increase the sound resolution. Utilizing non-linear signal conditioning enables an 8 bit input signal to have the response of a 13 bit resolution voice signal. This higher resolution is obtained without having to provide the hardware for the higher resolution.

The introduction of the DSP 62 raises another important difference between the prior art and the present invention. Among reasons such as yo decrease cost of the system and increase system throughput, the micro-controller is eliminated. Modern DSPs can include within their structure an imbedded micro-controller. Accordingly, program instructions which were previously executed by a separate micro-controller are now accomplished within the DSP 62 itself. It should be realized that elimination of the micro-controller also reduces the total size of a circuit board, as well as reduce the system power requirements.

Functioning with the DSP 62 is a time base 64 which provides a real time clock (RTC), as well as a phase-locked loop (PLL). This time base 64 enables the DSP to control timing functions which are necessary for voice data segments to be stored and recalled in proper sequence.

The present invention also includes a digital volume controller 66, an amplifier 68, an external loudspeaker 70, and an earphone jack 72 for private listening.

Associated with the DSP 62 is a liquid crystal display (LCD) controller 74, and a backlit LCD 76. Along with this display which enables the display of words are LEDs 78 which enable non-alphanumeric display of information.

The DSP 62 is coupled by a bus control bus 80, a data bus 82 and an address bus 84 to other system components. For example, the executable program instructions are stored in a presently preferred embodiment in a flash ROM 86. These program instructions include a boot-up program for system initialization, as well as program instructions for controlling the various functions of the handheld record and playback device.

A particularly advantageous feature of the present invention includes the aspect of upgrading the flash ROM 86 which is coupled to the three buses 80, 82 and 84. As various functions are enabled on the handheld record and playback device, for example, through the addition of various hardware attachments or upgrades, it is possible to enable the device to accomplish more than is presently programmed at any given time. Accordingly, the ability to change and update a presently existing program stored in flash ROM 86 is an ability which enables the present invention to take advantage of functions either not contemplated or not implemented.

Another component which may be coupled to the three buses is an input device which is new to the present invention. Specifically, a keyboard 88 is a feature which can be implemented in various ways. For example, the keyboard 88 could be a very small input device which is not intended for use by fingers. Instead, a stylus or other small punch device (not shown) could be used to press keys. It should be apparent that single and multi-function control switches can also be coupled to the three buses.

Also coupled to the three buses is a memory cartridge port 90. At this interface 90, the main system memory is coupled to the device. Of course, flash memory in all of its different implementations can be used as explained previously. However, the present invention includes at this port 90 the ability to provide signals which are compatible with various data exchange formats. For example, in the presently preferred embodiment, the port 90 is able to provide signals which are compliant with an industry standard IDE hard drive memory card interface.

It is another advantage of the present invention to be able to provide industry compliant signals which are compatible with long-term storage media. In this way, a flash memory coupled to the port 90 could be removed from the handheld record and playback device and coupled to a port on a personal computer which is also compliant with the IDE hard drive memory card interface in order to exchange data therebetween.

Although the present invention is able to store data in a format which is readable by the IDE hard drive memory card interface, the underlying data is advantageously stored in accordance with the NORRIS FLASH FILE SYSTEM as disclosed in the parent application. Alternatively, the present invention makes possible a hybrid combination of the NORRIS FLASH FILE SYSTEM and the IDE hard drive memory card interface which follows more closely the conventional memory scheme of the IDE hard drive memory card interface. Nevertheless, the advantages of the present invention are better realized by manipulating data and executing voice message creation, insertion, deletion and other record and playback functions in accordance with the NORRIS FLASH FILE SYSTEM.

The presently preferred embodiment of the present invention also includes the use of two advantageous methods of input, and one new advantageous method of output. One of the new methods of input is comprised of a barcode reader 90. A barcode reader 90 is an optical sensor which is typically implemented as some type of laser emitting device and a laser sensor. Barcode readers are often utilized in grocery stores to read prices from UPC labels. However, the uses of barcodes go beyond commercial retail. For example, when a doctor makes rounds, it is often necessary to dictate information to be included in a medical file. The notes are often made while the doctor has the file. The dictation notes can be correlated to a particular file by including barcode labels on the files. A transcriptionist is then easily able to determine to which file the transcribed notes pertain by accessing the associated barcode label which the doctor scanned with the barcode reader 90 when making the notes. The example above only illustrates one possible use for a barcode reader implemented in the handheld record and playback device.

Additional circuitry required by the barcode reader 90 is a signal amplifier and digitizer 92, and a decoder 94 which interprets the digitized barcode signal. The decoded signal is transferred to the DSP 62 for utilization as required.

The remaining newly implemented methods of input and output in the present invention are related technology. Specifically, an infra-red transceiver 96 is provided with an associated infra-red input/output controller 98. The infra-red I/O controller is in turn coupled to the DSP 62 which transmits signals to and receives signals from the infra-red transceiver 96. It is believed that the present invention is the first implementation of an infra-red transceiver in a handheld record and playback device which is advantageously capable of transmitting and receiving voice data.

The infra-red transceiver 96 capabilities are provided for various reasons. For example, it can be used for data collection. It should also be realized that the data can be comprised of voice, demographic, configuration and program data. The infra-red transceiver 96 also makes possible the rapid exchange of data between handheld record and playback devices without having to exchange data recording media. The data can also be transferred between a handheld record and playback device and a personal computer.

A final system of the handheld record and playback device to be improved is the power supply 100. The system can include a battery 104, as well as a battery charger 100. Alternatively, power can be supplied through a power jack 102.

Figure 4:
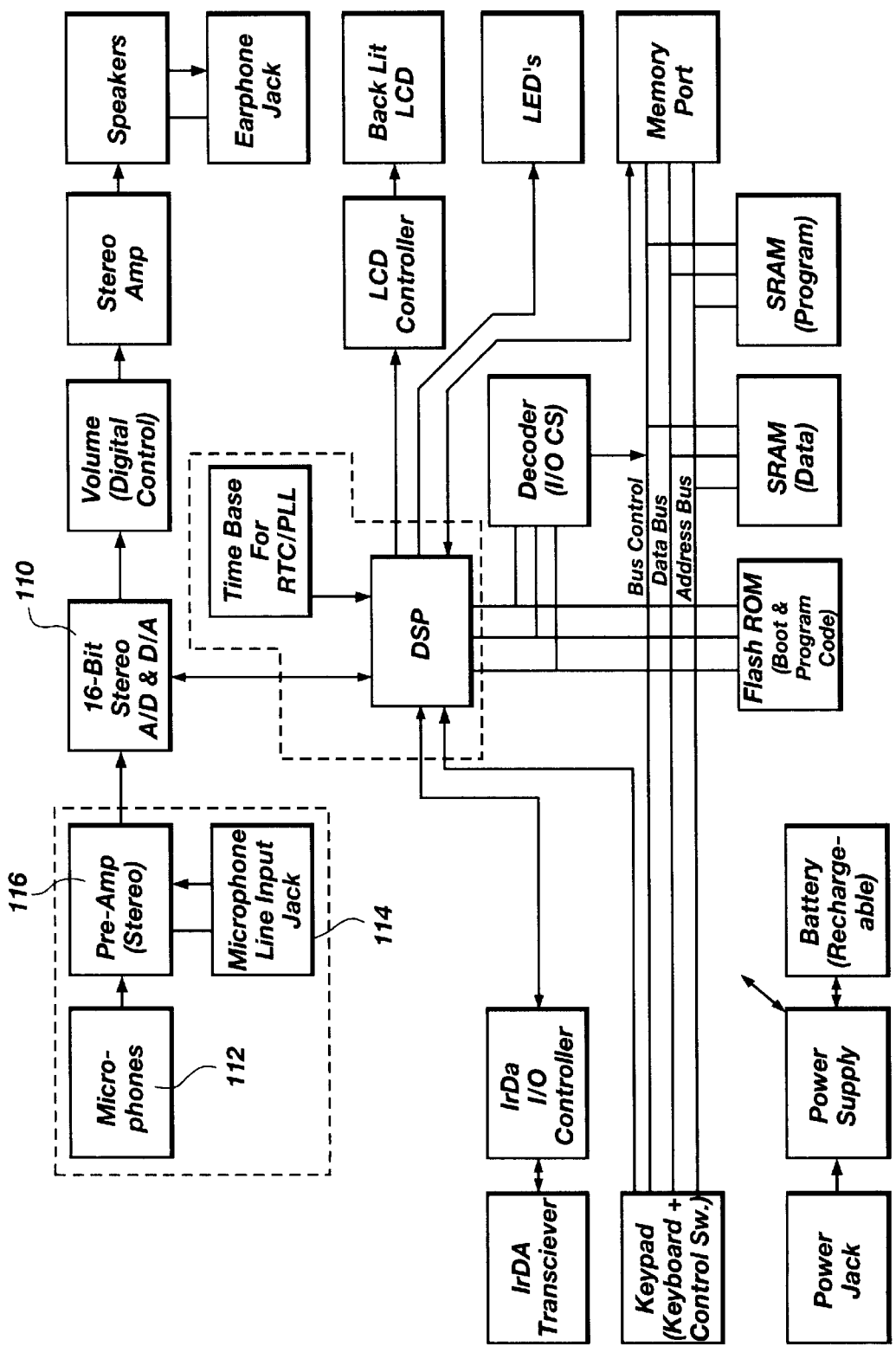
FIG. 4 is a block diagram of the components in a presently preferred embodiment of the present invention which enables a handheld record and playback device to record and playback music data at CD quality levels in accordance with the teachings of the present invention.

The differences between the presently preferred voice record and playback embodiment of FIG. 3 and the presently preferred music record and playback embodiment of FIG. 4 are mainly limited to a modification of the music input system, and elimination of the barcode reader system 90, 92 and 94.

Specifically, the music input system must provide better sound resolution than the voice embodiment. This is implemented in order to provide for CD quality sound recording and playback. Typically, CD quality sound capabilities are not expected from a device which does not provide the ability to play a CD. However, flash memory which is typically utilized as the storage medium for the present invention is capable of storing the large amount of audio data which is typically stored on a CD. CDs hold a large amount of data in order to provide the significantly higher sound resolution of music as compared to voice data. For example, the presently preferred embodiment of the voice system samples data at a rate of 8 KHz. However, CD quality sound reproduction requires sampling data at a rate of 44.1 KHz. Accordingly, the CODEC 60 of FIG. 3 is replaced with a 2 channel 16 bit stereo sound A/D and D/A circuit 110. The 13 bit effective rate of the voice system of figure is improved to the 16 bit system required for CD quality sound recording and playback. It should be noted that the music embodiment of FIG. 4 results in an uncompressed data rate of 176,000 bytes/second as compared to 8,000 bytes/second for the voice embodiment.

CD quality recording and playback is heretofore unprecedented in a handheld record and playback device such as the present invention. However, by transferring CD music files to a flash memory unit, the flash memory can be coupled to the present invention, effectively resulting in a CD player without moving parts or the CD.

The music embodiment of FIG. 4 is also different in the microphone input. Whereas the voice embodiment only required monaural capabilities, recording requires use of a true stereo microphone 112 to record two channels of sound. Likewise, a microphone or line input jack 114 can be provided for direct electrical coupling of a signal to the handheld record and playback device. Both the jack 114 and stereo microphone 112 inputs feed to a stereo signal preamplifier 116. The pre-amplifier 116 sends its signals to the 16 bit stereo A/D and D/A 2 channel converter 110.

What may not be realized is that the present invention is capable of recording to and receiving data from all existing implementations of flash memory, including NOR, captive NAND and CompatchFlash memory modules operating in IDE mode. Only minor modifications are required in the NORRIS FLASH FILE SYSTEM in order to implement the different types of flash memory. Yet this capability enables the present invention to utilize the most inexpensive or best flash memory available. The operating system changes are focused, for example, about the varying methods of addressing the flash memory, and changes in "sector" and "block" sizes.

The CompactFlash memory module is also capable of going directly from the memory port 90 of the present invention directly to a port on a laptop of desktop personal computers with an PCMCIA interface. In this example, playing a CD on the present invention would then involve copying data from the CD in a laptop or desktop computer to the CompactFlash memory module. The CompactFlash memory module would then be inserted into the memory port 90 of the present invention. However, as a practical matter and in order to reduce memory costs, the data will typically be compressed on the laptop or desktop computer before copying it to the CompactFlash or other flash memory module. The presently preferred embodiment then provides for decompressing the data real-time during playback.

The compression algorithm implemented in the present invention can vary as necessary and as technology changes. However, industry standards such as MPEG-2 can presently be utilized.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method of memory management for a primary memory created from a non-volatile, long-term storage medium, said method enabling direct manipulation of contiguous and non-contiguous discrete data segments stored therein by a file system, and comprising the steps of:

(a) creating the primary memory from a non-volatile, long-term storage medium, wherein the primary memory comprises a plurality of blocks in which the data segments are to be stored;

(b) coupling a cache memory to the primary memory, said cache memory providing temporary and volatile storage for at least one of the data segments;

(c) writing a new data segment from the cache memory to the primary memory by linking said new data segment to a sequentially previous logical data segment by the following steps:

(1) receiving the new data segment in the cache memory;

(2) moving the new data segment from the cache memory to a next available space within primary memory such that the new data segment is stored in primary memory in non-used memory space;

(3) identifying the previous logical data segment in primary memory;

(4) creating a logical link between the previous logical data segment and the new data segment such that the logical link provides a path for sequentially accessing the data segments within the primary memory;

(5) creating additional serial and logical links as subsequent new data segments are written to primary memory, said logical links providing the path for serially accessing the data segments regardless of contiguity of the data segments relative to each other within the primary memory; and (6) storing the data segments to primary memory in a manner consistent with an industry standard data storage format while retaining linking between data segments created in previous steps.

2. A record/playback device for use with a removable, interchangeable, flash memory recording medium which enables extended voice recording comparable with tape cassette dictating equipment, said device comprising:

a housing;

a first microphone element coupled to the housing and configured to receive and process sound into electrical signals;

a second microphone element coupled to the housing and configured to receive and process sound so as to cancel noise received at the first microphone element;

control circuitry coupled to the microphone element and including signal input circuitry, amplification circuitry, analog-to-digital conversion circuitry, memory control circuitry, signal output circuitry and control logic circuitry for performing record and playback functional operations with respect to the electrical signals and other regulated components of the record/playback device;

said switch means coupled to the control circuitry for selecting the desired functional operations to be performed;

a receiving socket electrically coupled to the memory control circuitry and configured for electrical coupling with a flash memory module which operates as sole memory of the received processed sound electrical signals and is capable of retaining recorded digital information for storage in nonvolatile form; and a speaker coupled to the control circuitry for playback of recorded digital information; and a power source coupled to the control circuitry for supplying electrical power to the device.

3. The device as defined in claim 2 wherein the device further comprises a barcode reader coupled to the digital signal processor for optically scanning barcode data, amplifying and digitizing the barcode data, decoding the barcode data and transmitting the barcode data to the digital signal processor.

4. The device as defined in claim 2 wherein the device further comprises an infra-red transceiver circuit coupled to the digital signal processor for selectively transmitting data from the digital signal processor, and for selectively receiving data which is transmitted to the digital signal processor.

5. A record/playback device for use with a removable, interchangeable, flash memory recording medium which enables music recording and playback comparable with compact disc (CD) quality equipment, said device comprising:

a housing;

a first microphone element coupled to the housing and configured to receive and process a first channel of sound into electrical signals;

a second microphone element coupled to the housing and configured to receive and process a second channel of sound into electrical signals;

a two channel, CD quality stereo signal pre-amplifier for receiving the first channel and the second channel of sound from the first and the second microphones;

control circuitry coupled to the microphone element and including two channel analog-to-digital conversion circuitry, memory control circuitry, signal output circuitry and control logic circuitry for performing music record and playback functional operations with respect to the electrical signals and other regulated components of the record/playback device;

said switch means coupled to the control circuitry for selecting the desired functional operations to be performed;

a receiving socket electrically coupled to the memory control circuitry and configured for electrical coupling with a flash memory module which operates as sole memory of the received processed sound electrical signals and is capable of retaining recorded digital information for storage in nonvolatile form; and a speaker coupled to the control circuitry for CD quality playback of recorded digital information; and a power source coupled to the control circuitry for supplying electrical power to the device.

6. The device as defined in claim 5 wherein the device further comprises an infra-red transceiver circuit coupled to the digital signal processor for selectively transmitting data from the digital signal processor, and for selectively receiving data which is transmitted to the digital signal processor.

* * * * *

UNITED STATES PATENT AND TRADEMARK OFFICE
CERTIFICATE OF CORRECTION

PATENT NO. : 5,839,108
APPLICATION NO. : 08/884245
DATED : November 17, 1998
INVENTOR(S) : Daberko et al.

It is certified that error appears in the above-identified patent and that said Letters Patent is hereby corrected as shown below:

Column 11, line 56 in claim 2, please delete the word "said"

Column 12, line 42 in claim 5, please delete the word "said"

Signed and Sealed this

Twenty-fifth Day of September, 2007

JON W. DUDAS
*Director of the United States Patent and Trademark Office*